US010594270B1

(12) United States Patent
Seckin (10) Patent No.: US 10,594,270 B1
(45) Date of Patent: Mar. 17, 2020

(54) SUPPLY MODULATOR FOR POLAR POWER AMPLIFIER

(71) Applicant: Apple Inc., Cupertino, CA (US)

(72) Inventor: Utku Seckin, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/057,813

(22) Filed: Aug. 7, 2018

(51) Int. Cl.
*H03F 1/42* (2006.01)
*H03F 3/19* (2006.01)
*H03F 3/24* (2006.01)
*H04L 27/36* (2006.01)
*H04B 1/40* (2015.01)
*H04L 27/04* (2006.01)

(52) U.S. Cl.
CPC ............. *H03F 1/42* (2013.01); *H03F 3/19* (2013.01); *H03F 3/245* (2013.01); *H04B 1/40* (2013.01); *H04L 27/04* (2013.01); *H04L 27/366* (2013.01); *H03F 2200/36* (2013.01); *H03F 2200/504* (2013.01)

(58) Field of Classification Search
CPC ... H03F 1/42; H03F 3/19; H03F 3/245; H04B 1/40; H04L 27/04; H04L 27/366

USPC ........................................................ 375/297
See application file for complete search history.

(56) References Cited

U.S. PATENT DOCUMENTS

| 7,515,885 B2 | 4/2009 | Sander et al. |
| 8,901,905 B2 | 12/2014 | Fayed et al. |
| 2015/0171856 A1 | 6/2015 | Yoo et al. |
| 2019/0222178 A1* | 7/2019 | Khlat ................ H03F 1/32 |

* cited by examiner

*Primary Examiner* — Michael R Neff
(74) *Attorney, Agent, or Firm* — Kowert, Hood, Munyon, Rankin & Goetzel, P.C.; Erik A. Heter (57) ABSTRACT

A supply modulator for a polar power amplifier and method for operating the same are disclosed. An apparatus includes an amplifier having an input for receiving a phase modulated (PM) signal. A modulator is arranged to receive an amplitude modulated (AM) signal and provide a supply voltage to the amplifier, the supply voltage varying based on the AM signal. A detector circuit may detect the supply voltage exceeding a first threshold or falling below a second threshold. The detector circuit includes a current source arranged to provide a bias current to the modulator. When the supply voltage exceeds the first threshold, the detector causes an increase in the bias current provided to the modulator. Similarly, when the supply voltage falls below a second threshold, the detector causes an increase of the bias current supplied to the modulator.

19 Claims, 6 Drawing Sheets

Fig. 6 ured by the appended claims.
SUPPLY MODULATOR FOR POLAR POWER AMPLIFIER

BACKGROUND

Technical Field

This disclosure is directed to amplifier circuits, and more particularly, supply modulators for power amplifiers in wireless transceivers.

Description of the Related Art

Polar transmitters are widely used in wireless transceivers, particularly in portable devices. These polar transmitters split the signal to be transmitted into phase-modulated (PM) and amplitude-modulated (AM) components. The PM signal drives a high frequency input to a power amplifier, while the AM signal is pass through a power supply modulator to drive a power supply of the power amplifier.

The design of a power supply modulator is important in meeting certain requirements, such as transmit mask requirements for many wireless standards. The design requirements include preservation of signal quality across the AM signal bandwidth and amplitude swing. Group delay requirements are also a consideration in the design.

To achieve a constant group delay, the supply modulator may be designed to limit the signal swing. Alternatively, the bandwidth is increased to a value exceeding the signal bandwidth.

SUMMARY

A supply modulator for a polar power amplifier and method for operating the same are disclosed. In one embodiment, an apparatus includes an amplifier having an input for receiving a phase modulated (PM) signal. A modulator is arranged to receive an amplitude modulated (AM) signal and provide a supply voltage to the amplifier, the supply voltage varying based on the AM signal. A detector circuit may detect the supply voltage exceeding a first threshold or falling below a second threshold. The detector circuit includes a current source arranged to provide a bias current to the modulator. When the supply voltage exceeds the first threshold, the detector causes an increase in the bias current provided to the modulator. Similarly, when the supply voltage falls below a second threshold, the detector causes an increase of the bias current supplied to the modulator.

In one embodiment, the detector includes a first circuit used to detect when the supply voltage exceeds the first threshold, and a second circuit used to detect when the supply voltage falls below the second threshold. The second threshold is less than the first threshold. Both the first and second circuits include respective current sources which, in this embodiment are coupled to the same node of the modulator, and thus collectively provide the bias current. In some embodiments, the first and second circuits, as well as their respective current sources, may be implemented separately from one another.

BRIEF DESCRIPTION OF THE DRAWINGS

The following detailed description makes reference to the accompanying drawings, which are now briefly described.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

The present disclosure is directed to a supply modulator used in applications such as a polar transmitter. The design of a supply modulator in such systems is an important part of meeting transmit mask requirements in various wireless standards. For example, in a polar transmitter, it is desirable to preserve signal quality across an amplitude modulated (AM) signal bandwidth and voltage swing. Accordingly, the design process may include balancing group delay requirements with AM signal swing range.

In previous systems, a constant group delay was achieved by either limiting the signal swing of the AM signal, or increasing the bandwidth of the supply modulator above the signal bandwidth. These approaches result in increased power consumption, and thus, lower efficiency. For example, limiting the swing of the AM signal reduces the efficiency by failing to use the full potential range of signal swing. Accordingly, the present disclosure is directed to an apparatus to achieve a constant group delay that does not rely on reducing the AM signal swing or increasing the bandwidth of the supply modulator.

Figure 1:
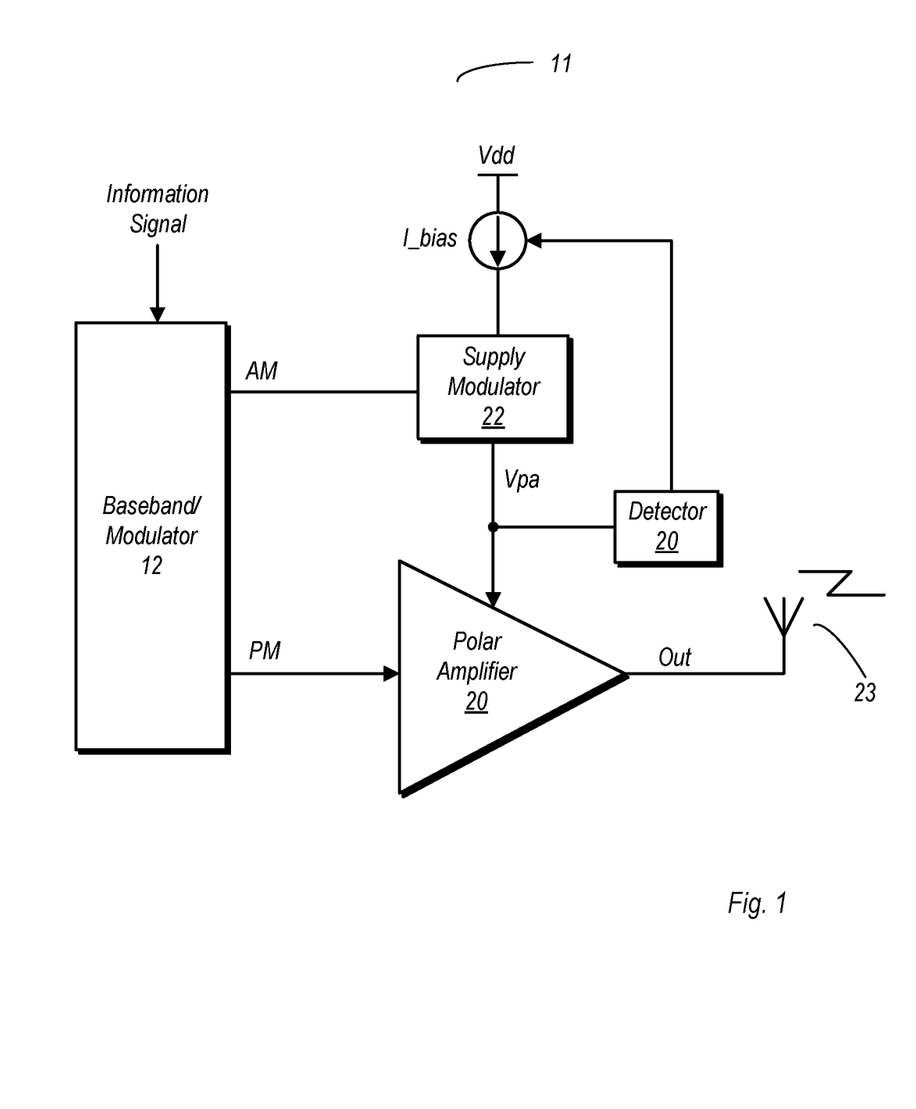
FIG. 1 is a block diagram illustrating one embodiment of an exemplary system and a graph of the supply voltage generated by a supply modulator.

Turning now to FIG. 1, a block diagram illustrating one embodiment of an example system and a graph of the supply voltage generated by a supply modulator is shown. In the embodiment shown, system 11 includes a baseband modulator 12, a polar amplifier 20 arranged to receive a phase modulated (PM) signal, a supply modulator 22, an antenna 23, a detector 20, and a bias current source labeled by the bias current it provides, I_bias. It is noted that in various embodiments, a portion of the bias current source may be considered to be part of the detector 20, and may actually include multiple current sources, as will be discussed below. Another portion of the bias current source I_bias may be part of supply modulator 22.

Baseband modulator 12 in the embodiment shown is a part of a polar transmission system. An information signal is received from an external source, such as a processor or some other system, and modulated within baseband modulator 12. Based on the information signal, baseband modulator 12 produces both a PM signal and an AM signal. The PM signal is provided directly to polar amplifier 20. The AM signal is provided to supply modulator 22. Polar amplifier 20 is further arranged to provide an output signal, Out, to antenna 23, where it is wirelessly transmitted. In particular, the amplifier in the embodiment shown provides an output signal to an antenna 23 based on the AM and PM signal. Accordingly, the output signal provided by power amplifier 20 is to antenna 23 is based on both the AM and PM signals, and thus has both AM and PM components.

Supply modulator 22 in the embodiment shown is arranged to provide a supply voltage Vpa to polar amplifier 20. Moreover, supply modulator 22 is configured to vary the supply voltage based on the received AM signal. The variation of the supply voltage is shown in the graphic on the right-hand side of the drawing, varying over time between a maximum voltage, V_max, and a minimum voltage, V_min.

Detector 20 in the embodiment shown includes circuitry for detecting the supply voltage exceeding a first threshold and further for detecting the supply voltage falling below a second threshold. More particularly, detector 20 includes a first circuit to detect the supply voltage exceeding the first threshold, and a second circuit to detect the supply voltage falling below the second threshold. Referring again to the graphic on the right-hand side of the drawing, an example of the first threshold is V_H and an example of the second threshold is V_L. The first threshold V_H is less than the maximum supply voltage, V_max, while the second threshold V_L is greater than the minimum supply voltage, V_min. Accordingly, detector 20 in the embodiment shown includes circuitry that detects Vpa exceeding V_H as well as circuitry detecting when Vpa falls below V_L. In one embodiment, two different circuits are implemented, as is discussed in further detail below.

Circuitry within supply modulator 22 is coupled to receive a bias current, I_bias. In one embodiment discussed below, a portion of the bias current is generated internally within supply modulator 22. Additionally, detector circuit 20 includes current source circuitry arranged to provide a portion of a bias current to supply modulator 22. In particular, the first circuit includes a first current source coupled to provide at a first portion of the bias current to the modulator, while the second circuit includes a second current source coupled to provide a second portion of the bias current to the modulator. Accordingly, although the current source for I_bias is shown as a separate entity in FIG. 1 for the sake of illustration, it is nonetheless noted that the source of I_bias may be distributed, including portions within detector 20 and partly within supply modulator 22 itself. Similarly, the total bias current I_bias may be a sum of currents provided by these distributed sources. However, embodiments are possible and contemplated in which the source(s) of the bias current is implemented separately from detector 20 and/or supply modulator 20.

Detector 20 in the embodiment shown controls the amount of at least a portion of the bias current provided to circuitry within supply modulator 22. Responsive to detecting the supply voltage Vpa exceeding the first threshold, V_H, detector 20 causes an increase of the bias current provided to supply modulator 22. Similarly, responsive to detecting the supply voltage falling below the second threshold, V_L, detector 20 again causes an increase of the bias current provided to supply modulator 22. Between these two values, V_H and V_L, the bias current may be maintained at a substantially steady value.

Increasing the bias current provided to the supply modulator when the supply voltage either exceeds the first threshold V_H or falls below the second threshold V_L may increase the efficiency of system 11. In particular, the increase of the bias current when a threshold is passed may allow for a fuller use of the AM signal swing and thus the range of the supply voltage without adversely affecting the group delay or necessitating any bandwidth increase.

Figure 2:
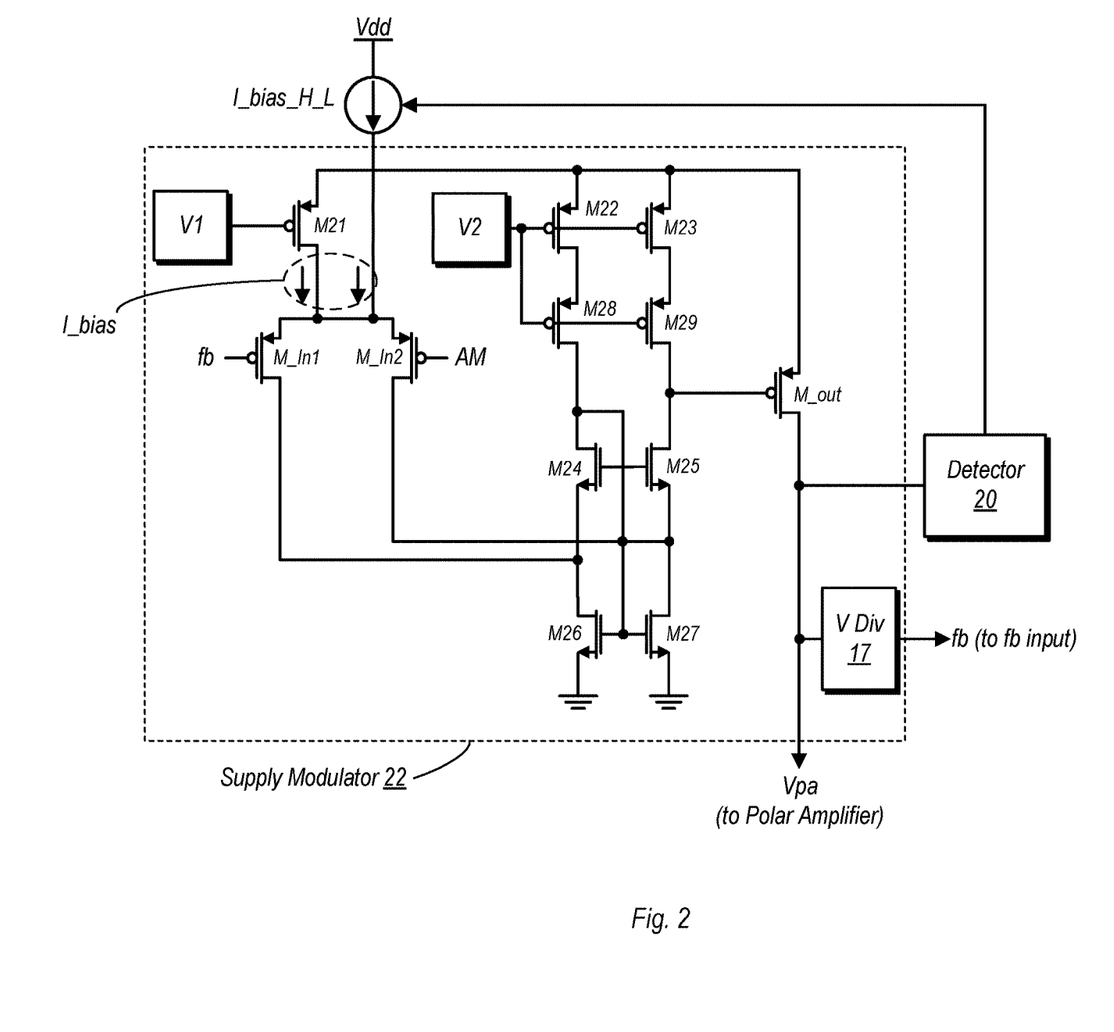
FIG. 2 is a schematic diagram of one embodiment of a supply modulator including a detector circuit.

FIG. 2 is a schematic diagram of one embodiment of a supply modulator 22. It is noted that other embodiments are possible and contemplated, and that the illustrated embodiment is a simplified version which does not necessarily show all components.

In the embodiment shown, supply modulator 22 is configured to receive the AM signal input on the gate terminal of transistor M_In2. Another transistor, M_In1 is coupled to receive a feedback input provided by voltage divider 17, which may be implemented using any suitable voltage divider configuration. A transistor M21 is arranged to provide a portion of a bias current to the coupled source terminals of M_In1 and M_In2, based on a bias voltage provided from bias voltage circuit V1. Any suitable circuit used to generate the bias voltage provided to the gate terminal of M21. The remaining portions of the bias current are provided by current sources within detector circuit, which are represented here by the current source I_bias_H_L. The total bias current provided to the source terminals of M_In1 and M_In2 is shown here as I_bias, and is the sum of the current from I_bias_H_L and the current through M21. Whereas the current through M21 is substantially constant and predetermined, the current I_bias_H_L may vary, particularly when the supply voltage Vpa goes beyond the bounds of the thresholds as discussed herein.

Transistors M_In1 and M_In2 effectively form a differential amplifier. This differential amplifier is coupled to a cascade current source that includes M24, M25, M26, and M27. The circuit also includes a cascode bias voltage circuit that includes transistors M22, M23, M28 and M29. The gate terminals of each of these devices are coupled to receive a bias voltage from bias voltage source V2. As with V1, bias voltage source V2 may be implemented using any suitable bias voltage generation circuitry. Collectively, the cascode bias voltage circuit along with the cascode current source form an output stage. A pass transistor, M_out, provides the supply voltage Vpa.

Detector 20 in the embodiment shown includes a first circuit arranged to detect the supply voltage exceeding the first threshold, and a second circuit arrange to detect the supply voltage falling below the second threshold. Example embodiments of the first and second circuits are discussed below in reference to FIGS. 3 and 4, respectively. Each of the first and second circuits includes respective current sources that provide a portion of a bias current, I_bias. These circuits, as noted above, increase the bias current when the supply voltage Vpa exceeds the first threshold V_H or falls below the second threshold, V_L. Collectively, the current sources of the first and second circuits along with M21 form a current source that provides the totality of the current labeled I_bias in FIGS. 1 and 2. Furthermore, the detector circuit is configured to cause the bias current to be maintained at a predetermined value when the supply voltage is less than the first threshold and greater than the second threshold. In one embodiment, the portion of the bias current provided by M21 is a substantially fixed and predetermined value, based on the bias voltage V1. The detector circuit 20 may add to the bias current when the supply voltage exceeds the first threshold, V_H, and when the supply voltage falls below the second threshold, V_L. In some embodiments, the detector circuit may output no current when the supply voltage is between these two values. In other embodiments, the detector circuit may provide a substantially steady state value of current when the supply voltage is between the two thresholds.

Figure 3:
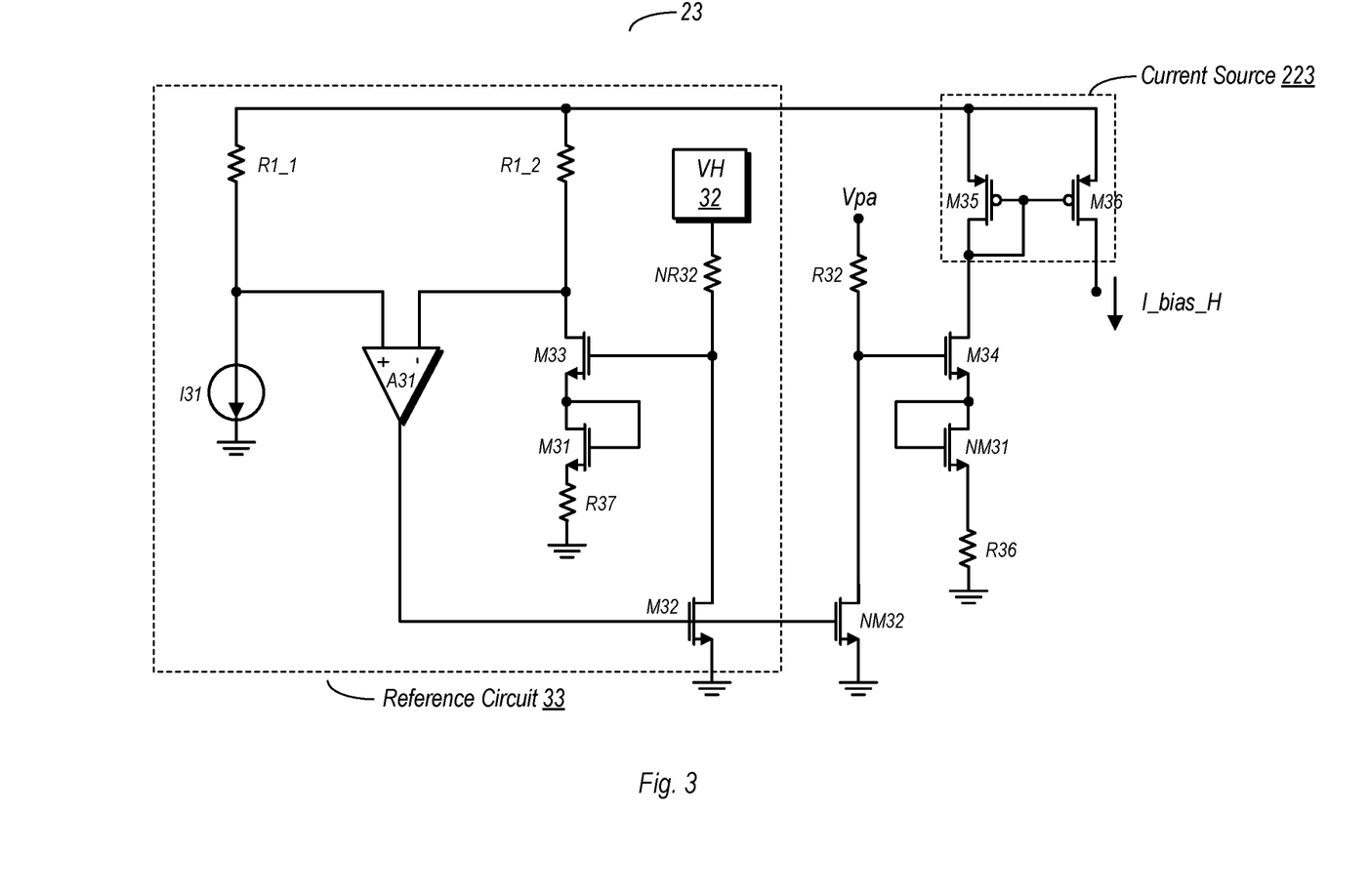
FIG. 3 is a schematic diagram of a portion of one embodiment of a detector circuit.

Turning now to FIG. 3, a schematic diagram of one embodiment of a first circuit, a V_H detector, is shown. As noted above, V_H detector 23 is part of detector 20, and thus forms the first circuit of the same. This first circuit includes a first reference circuit configure to establish a reference operating point corresponding to the first threshold and a first detection circuit arranged to detect when the supply voltage exceeds the first threshold. Reference circuit 33 in the embodiment shown establishes a reference point at which a portion of the output current, I_bias_H, is provided when Vpa is less than the first threshold, V_H. The first reference circuit includes an amplifier A31, having inverting and non-inverting inputs. The non-inverting input is coupled to the junction of resistor R1_1 and current source I31, the combination of which establishes a reference voltage input into A31. The inverting input of A31 is coupled to the junction of resistor R1_2 and transistor M33. In this embodiment, the resistance values of R1_1 and R1_2 are substantially the same. A feedback loop from the output of A31 to the inverting input is provided through transistors M32 and M33. Diode-coupled transistor M31 and resistor R37 establish a current through the branch coupled to the inverting input of A31.

The first detection circuit, which includes R32 and M32, detects when Vpa exceeds the first threshold V_H, and thus cause current source 223 to increase the amount of bias current I_bias_H. The first reference circuit includes an input coupled to receive a fixed voltage corresponding to the first threshold, V_H. The fixed voltage in this embodiment is provided by voltage generation circuit VH 32, which may be implemented using any suitable voltage generation circuitry. The first detection circuit includes an input coupled to receive the supply voltage, Vpa.

The reference operating point established by the first reference circuit 33 is an operating point that occurs in the circuit when the supply voltage Vpa is less than or equal to the first threshold V_H. In particular, the first reference circuit generates a first reference current, through M31. As noted above, the detection circuit is configured to generate a current that is proportional to this reference current through NM31. With regard to transistor M31, the current established through this devices is copied to transistor NM31 with a multiplication factor of N when Vpa is equal to V_H.

The supply voltage Vpa is received by the first detection circuit through R32. The first reference circuit receives the first threshold voltage, V_H, via NR32, which has a resistance value that it N times that of R32. The current through R32, and thus through NM32 (which draws a current that is N times that through M32) establishes a voltage on the input of M34. This in turn draws current through current source 223, which is implemented here as a 1:K current mirror including transistors M35 and M36. The mirrored current I_bias_H through M36 is provided as a portion of the total bias current, I_bias.

When Vpa exceeds V_H in the embodiment shown, the voltage on the gate terminal of M34 increases. This in turn results in an increase in current through the current mirror implementing first current source 223. Thus, the supply voltage Vpa exceeding the first reference voltage V_H therefore causes an increase in the bias current provided to the supply modulator. In one embodiment, when Vpa falls below V_H, the voltage on the gate terminal of M34 may fall below its threshold voltage for activation. As such, M34 may enter the cutoff region, and thus not conduct any substantial current. When this occurs, the current provided by current source 223, I_bias_H, may fall to a negligible amount (e.g., leakage current), if not falling to zero altogether.

It is noted that the relation between I_bias_H and Vpa can be adjusted between exponential and linear by proper sizing of circuit elements M31, R37, NM31 and R36. At one extreme, R37 and R36 can be removed to achieve an exponential relation between I_bias_H and Vpa. At the other extreme, M31 and NM31 can be removed to achieve a linear relation between I_bias_H and Vpa.

Figure 4:
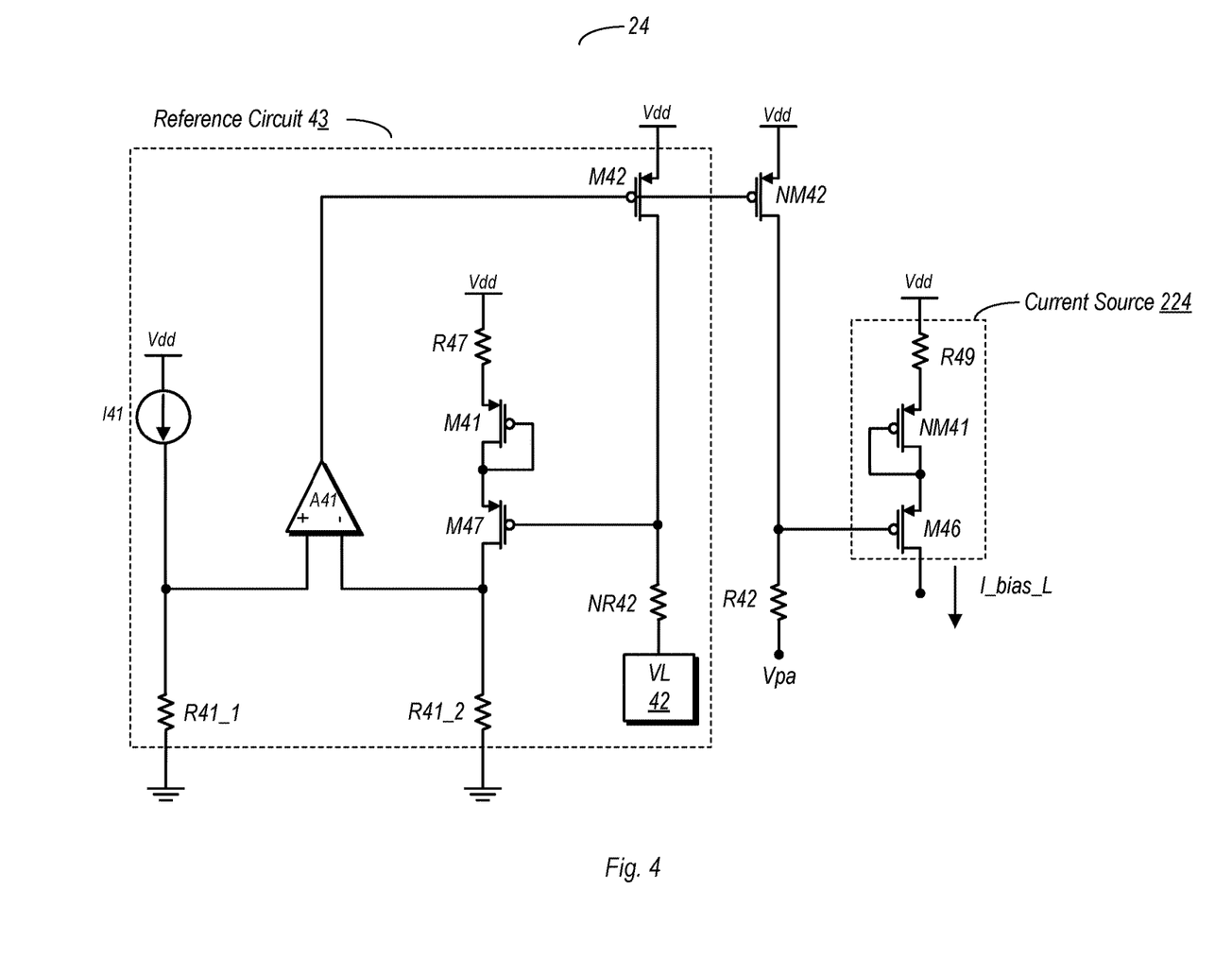
FIG. 4 is a schematic diagram of another portion of one embodiment of a detector circuit.

FIG. 4 is a schematic diagram of one embodiment of a second circuit of detector 20, V_L detector 24 in this example. In the embodiment shown, V_L detector include a second reference circuit arranged to establish a reference point corresponding to the second threshold, as well as a second detection circuit arranged to detect when the supply voltage falls below the second threshold. In this embodiment, reference circuit 43 is an example of the second reference circuit, while the circuit branch including NM42 and R42 is an example of the second detection circuit. V_L detector 24 also includes a current source 224, which includes resistor R49 and transistors NM41 (which is diode coupled in this embodiment) and M46.

Reference circuit 43 in the embodiment shown includes an amplifier A41 having inverting and non-inverting inputs. The non-inverting input is coupled to the junction between current source I41 and resistor R41_1. The voltage input to the non-inverting input is thus the current through I41 multiplied by the resistance of R41_1. The inverting input of A41 is coupled to the junction of R41_2 and the drain terminal of M47. Thus, the current through M47 multiplied by the resistance of R41_2 creates the voltage input to the inverting amplifier of A41. In this embodiment, the resistance values of R41_1 and R41_2 are substantially equal. A feedback path between the output of A41 and the inverting input is provided via transistor M42 and M47. Transistor M42 is coupled to M47 and further coupled to R47.

The second reference circuit, reference circuit 43, includes an input coupled to receive a fixed voltage corresponding to the second threshold. The fixed voltage is received from voltage generation circuit VL 42, which may be any suitable circuitry for generating a fixed voltage. The second detection circuit, which includes MN42 and R42, includes an input coupled to receive the supply voltage Vpa. The second threshold voltage, V_L is received via resistor NR42, while the supply voltage Vpa is received via resistor R42. Resistor NR42 has a resistance value that is N times the resistance value of R2.

The second reference circuit 43 in the embodiment shown generates a second reference current, through M42. The detection circuit 43 generates a current that is proportional to the second reference current, through NM42. The current through NM42 is copied from M42 and multiplied N times. Similarly, the current through M41 is copied and multiplied N times through NM41 of current source 224 when Vpa and V_L are equal. It is noted that the current through M41 is copied from current source I41.

When Vpa falls below the second threshold, V_L, the voltage on the gate terminal of M46 falls correspondingly. As a result, the current drawn through both M46 and NM41 increases, and thus, I_bias_L increases. In one embodiment, when the supply voltage Vpa rises to a sufficient value, the threshold voltage for M46 may be exceeded, and thus this device may enter the cutoff region. When M46 enters cutoff, the current provided by current source 224, I_bias_L, is negligible (e.g., at leakage levels), if not zero.

As noted above, one embodiment of a detector 20 including first and second detection circuits may cause the bias current to remain at a predetermined value when Vpa is between the first and second thresholds, V_H and V_L, respectively. For example, one embodiment of a detector may include detection circuits 23 and 24 as discussed above arranged in such a manner that neither of their respective current sources provides any substantial contribution to the bias current when the supply voltage is between the threshold values (e.g., less than V_H, greater than V_L). In such an embodiment, transistor M21 as shown in FIG. 2 would provide the non-negligible portion of the bias current. Another embodiment is possible and contemplated wherein the sum of the currents provided by the respective current sources of the first and second detection circuits is a non-negligible value that remains substantially the same when the supply voltage Vpa is between the first and second thresholds V_H and V_L, respectively.

Similar to the circuit of FIG. 3, certain changes to the circuitry of V_L detector 24 may be implemented to vary the relationship of I_bias_L and Vpa between exponential and linear by varying the values of certain devices in the circuit. For example, similar variations may be applied to M41, R47, NM41, and R49 to vary the relationship of I_bias_L and Vpa in V_L detector 24 as are discussed above with respect to M31, R37, NM31, and R36 of V_H detector 23.

Figure 5:
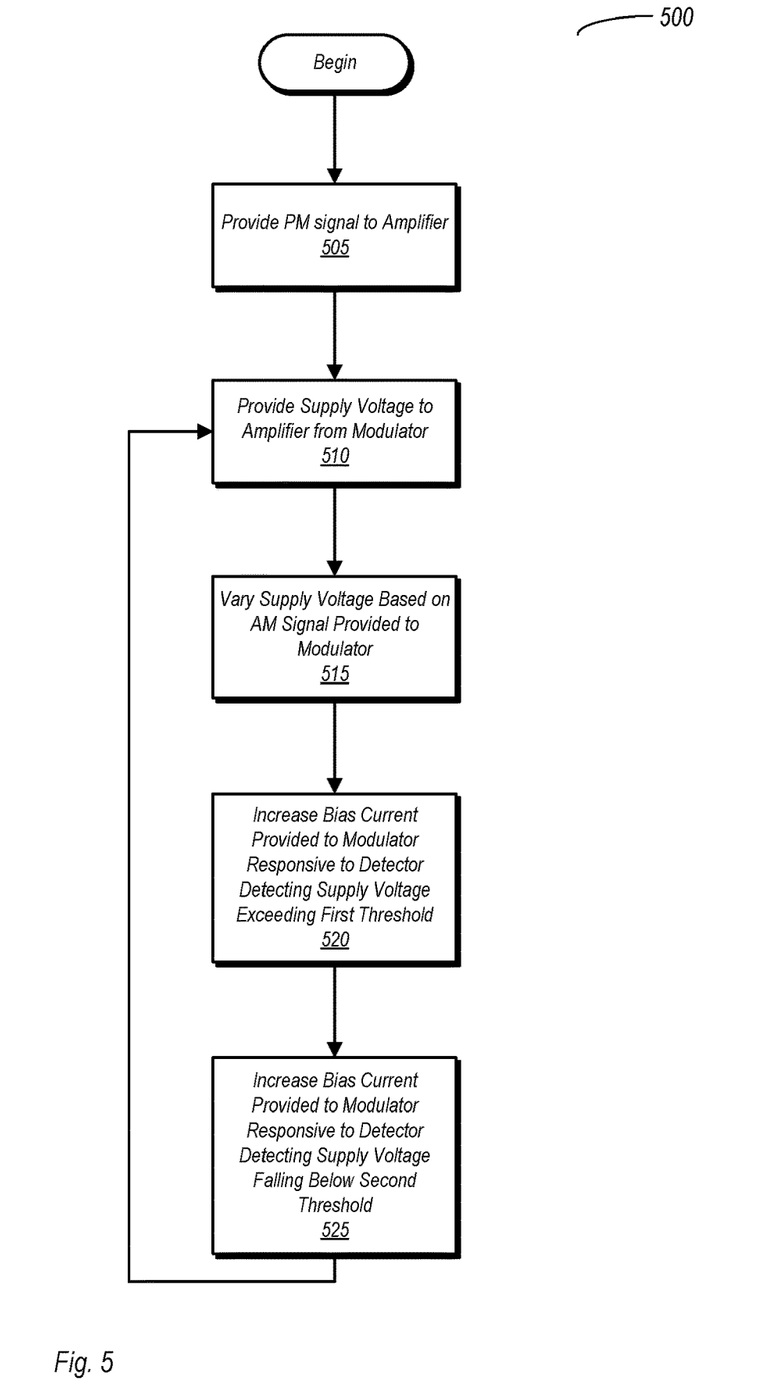
FIG. 5 is a flow diagram of one embodiment of a method for operating a supply modulator.

FIG. 5 is a flow diagram of one embodiment of a method or operating a supply modulator. Method 500 may be performed with any of the hardware/circuit embodiments discussed above, and may additionally be performed with embodiments not explicitly discussed herein. Such circuit/hardware embodiments that are capable of carrying out method 500 may fall within the scope of this disclosure.

Method 500 begins with the providing of a phase modulated (PM) signal to an amplifier (block 505). The method further includes providing, from a modulator, a supply voltage to the amplifier (block 510), and varying the supply voltage based on an amplitude modulated (AM) signal provided to the modulator (block 515). As the bias voltage varies, it sometimes exceeds a first threshold, or falls below a second threshold.

Method 500 further includes increasing a bias current provided from a first current source to the modulator responsive to detecting, using a detector circuit, the supply voltage exceeding a first threshold (block 520). The detector, in one embodiment, includes a first circuit and a second circuit. Accordingly, an embodiment of the method a first circuit in the detector detecting the supply voltage exceeding the first threshold. The first circuit includes a first reference circuit and a first detection circuit, and thus an embodiment of the method further includes the first reference circuit establishing a first reference operating point corresponding to the first threshold and the first detection circuit detecting the supply voltage exceeding the first threshold using the first reference operating point. In various embodiments, the method further includes the first reference circuit generating a first reference current, the first detection circuit generating a current that is proportional to the first reference current, and a first current source providing at least a portion of the bias current based at least in part on the first reference current.

Method 500 further includes increasing the bias current provided to the modulator responsive to the detector detecting the supply voltage falling below a second threshold, the second threshold being less than the first threshold (block 525). This includes, in various embodiments, a second circuit in the detector detecting the supply voltage exceeding the second threshold. The second circuit includes a second reference circuit and a second detection circuit. Accordingly, various embodiments of the method further include the second reference circuit establishing a second reference operating point corresponding to the second threshold and the second detection circuit detecting the supply voltage falling below the second threshold using the second reference operating point. Various embodiments of the method may further include the second reference circuit generating a second reference current, the second detection circuit generating a current that is proportional to the second reference current, and a second current source providing at least a portion of the bias current based at least in part on the second reference current. Additional embodiments of the method may include maintaining the bias current at a predetermined value when the supply voltage is less than the first threshold and greater than the second threshold.

Figure 6:
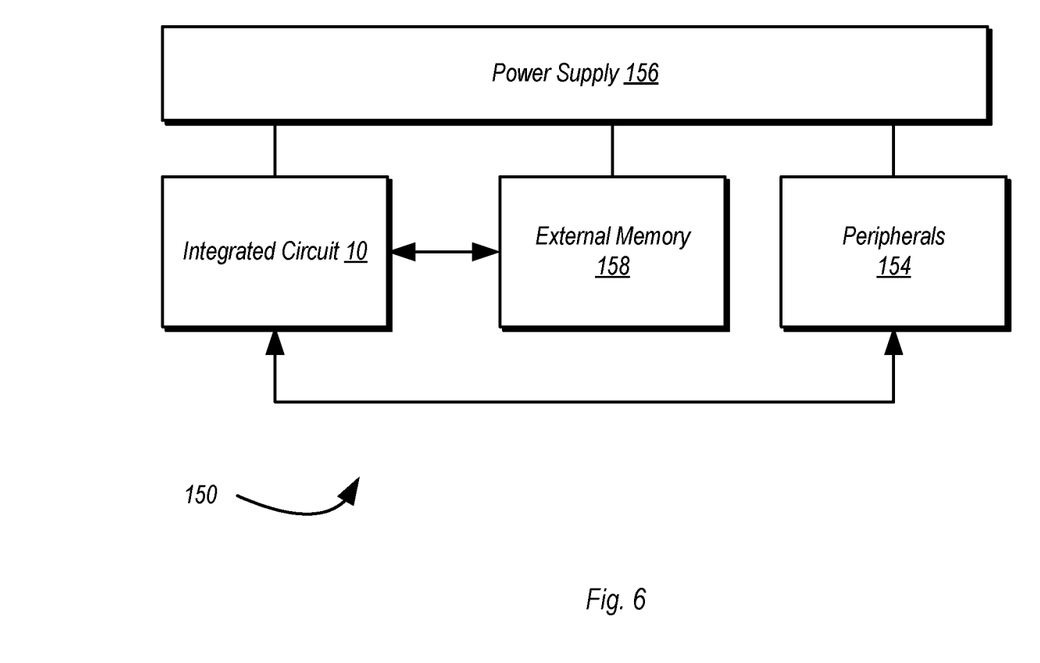
FIG. 6 is a block diagram of one embodiment of an example system.

Turning next to FIG. 6, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.). In some embodiments, the peripherals 154 may include radio transmitter circuitry that includes various embodiments of the circuitry discussed above with reference to FIG. 4 and/or circuits capable of carrying out the method discussed with reference to FIG. 5.

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An apparatus comprising:
an amplifier having an input configured to receive a phase modulated signal;
a modulator configured to provide a supply voltage to the amplifier, wherein the modulator is configured to vary the supply voltage based on an amplitude modulated (AM) signal received thereby; and
a detector circuit configured to detect the supply voltage exceeding a first threshold and further configured to detect the supply voltage falling below a second threshold; and
wherein the detector circuit is configured to provide at least a portion of a bias current to the modulator, wherein the detector circuit is configured to cause an increase to the bias current responsive to detecting the supply voltage exceeding the first threshold and further configured to cause an increase to the bias current responsive to detecting the supply voltage falling below the second threshold, wherein the detector circuit comprises a first circuit configured to detect the supply voltage exceeding the first threshold, and a second circuit configured to detect the supply voltage falling below the second threshold.

2. The apparatus as recited in claim 1, wherein the first circuit includes a first reference circuit configured to establish a reference operating point corresponding to the first threshold and a first detection circuit configured to detect when the supply voltage exceeds the first threshold.

3. The apparatus as recited in claim 2, wherein the first reference circuit includes an input coupled to receive a fixed voltage corresponding to the first threshold, and wherein the first detection circuit includes an input coupled to receive the supply voltage.

4. The apparatus as recited in claim 2, wherein the first reference circuit is configured to generate a first reference current, and wherein the detection circuit is configured to generate a current that is proportional to the first reference current.

5. The apparatus as recited in claim 1, wherein the second circuit includes a second reference circuit configured to establish a reference point corresponding to the second threshold, and a second detection circuit configured to detect when the supply voltage falls below the second threshold.

6. The apparatus as recited in claim 5, wherein the second reference circuit includes an input coupled to receive a fixed voltage corresponding to the second threshold, and wherein the second detection circuit includes an input coupled to receive the supply voltage.

7. The apparatus as recited in claim 5, wherein the second reference circuit is configured to generate a second reference current, and wherein the detection circuit is configured to generate a current that is proportional to the second reference current.

8. The apparatus as recited in claim 1, wherein the detector circuit is configured to cause the bias current to be maintained at a predetermined value when the supply voltage is less than the first threshold and greater than the second threshold.

9. A method comprising:
providing a phase modulated (PM) signal to an amplifier;
providing, from a modulator, a supply voltage to the amplifier;
varying the supply voltage based on an amplitude modulated (AM) signal provided to the modulator;
increasing a bias current provided from a current source to the modulator responsive to detecting, using a detector circuit, the supply voltage exceeding a first threshold; and
increasing the bias current provided to the modulator responsive to the detector circuit detecting the supply voltage falling below a second threshold, the second threshold being less than the first threshold.

10. The method as recited in claim 9, further comprising maintaining the bias current at a predetermined value when the supply voltage is less than the first threshold and greater than the second threshold.

11. The method as recited in claim 9, further comprising:
a first circuit in the detector circuit detecting the supply voltage exceeding the first threshold;
a second circuit in the detector circuit detecting the supply voltage exceeding the second threshold.

12. The method as recited in claim 11, wherein the first circuit includes a first reference circuit and a first detection circuit, and wherein the method further comprises:
the first reference circuit establishing a first reference operating point corresponding to the first threshold; and
the first detection circuit detecting the supply voltage exceeding the first threshold using the first reference operating point.

13. The method as recited in claim 12, further comprising:
the first reference circuit generating a first reference current;
the first detection circuit generating a current that is proportional to the first reference current;
a first current source providing at least a portion of the bias current based at least in part on the first reference current.

14. The method as recited in claim 11 wherein the second circuit includes a second reference circuit and a second detection circuit, and wherein the method further comprises:
the second reference circuit establishing a second reference operating point corresponding to the second threshold; and
the second detection circuit detecting the supply voltage falling below the second threshold using the second reference operating point.

15. The method as recited in claim 14, further comprising:
the second reference circuit generating a second reference current;
the second detection circuit generating a current that is proportional to the second reference current;
a second current source providing at least a portion of the bias current based at least in part on the second reference current.

16. A system comprising:
a baseband circuit configured to output an amplitude modulated (AM) and a phase modulated (PM) signal;
a amplifier coupled to receive the PM signal;
a modulator coupled to receive the AM signal and coupled to provide a supply voltage to the amplifier and further configured to vary the supply voltage based on the AM signal; and
a detector circuit configured to cause an increase to a bias current provided to circuitry in the modulator responsive to detecting the supply voltage exceeding a first threshold, and further configured to cause an increase to the bias current responsive to detecting the supply voltage falling below a second threshold, the second threshold being less than the first threshold.

17. The system as recited in claim 16, wherein the detector circuit includes:
a first circuit configured to detect the supply voltage exceeding the first threshold, wherein the first circuit includes a first current source coupled to provide at a first portion of the bias current to the modulator;
a second circuit configured to detect the supply voltage falling below the second threshold, wherein the second circuit includes a second current source coupled to provide a second portion of the bias current to the modulator.

18. The system as recited in claim 16, wherein the first threshold is less than a maximum supply voltage and wherein the second threshold is greater than a minimum supply voltage.

19. The system as recited in claim 16, wherein the amplifier is configured to provide an output signal to an antenna based on the AM and PM signal.

* * * * *